(12) United States Patent
Kang et al.

(10) Patent No.: US 9,083,344 B2
(45) Date of Patent: Jul. 14, 2015

(54) TOUCH SENSOR WITH INTEGRATED SIGNAL BUS EXTENSIONS

(75) Inventors: Sunggu Kang, San Jose, CA (US); John Z. Zhong, Cupertino, CA (US)

(73) Assignee: Apple Inc., Cupertino, CA (US)

(*) Notice: Subject to any disclaimer, the term of this patent is extended or adjusted under 35 U.S.C. 154(b) by 381 days.

(21) Appl. No.: 13/363,648

(22) Filed: Feb. 1, 2012

(65) Prior Publication Data

US 2013/0194759 A1  Aug. 1, 2013

(51) Int. Cl.
| H05K 1/18 | (2006.01) |
| H03K 17/96 | (2006.01) |
| H05K 7/00 | (2006.01) |
| G06F 3/044 | (2006.01) |
| G06F 3/0488 | (2013.01) |

(52) U.S. Cl.
CPC ............ *H03K 17/9622* (2013.01); *G06F 3/044* (2013.01); *H05K 1/181* (2013.01); *H05K 7/00* (2013.01); *G06F 3/0488* (2013.01); *H03K 2217/94094* (2013.01); *H03K 2217/96031* (2013.01); *H05K 2201/10128* (2013.01); *H05K 2201/10189* (2013.01)

(58) Field of Classification Search
CPC ... G06F 3/044; G06F 3/0488; G06F 3/04883; G06F 3/04886; G02F 1/136204; H05K 2201/10128; H05K 2201/09081; H05K 2201/052; H05K 2201/053
USPC ........... 361/748, 749, 751, 755, 803; 345/173
See application file for complete search history.

(56) References Cited

U.S. PATENT DOCUMENTS

| 5,483,261 A | 1/1996 | Yasutake |
| 5,488,204 A | 1/1996 | Mead et al. |
| 5,825,352 A | 10/1998 | Bisset et al. |
| 5,835,079 A | 11/1998 | Shieh |
| 5,880,411 A | 3/1999 | Gillespie et al. |
| 6,188,391 B1 | 2/2001 | Seely et al. |

(Continued)

FOREIGN PATENT DOCUMENTS

| JP | 2000-163031 A | 6/2000 |
| JP | 2002-342033 A | 11/2002 |
| WO | 2006036950 | 4/2006 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Jayprakash N Gandhi
*Assistant Examiner* — Mukund G Patel
(74) *Attorney, Agent, or Firm* — Morrison & Foerster LLP

(57) ABSTRACT

A touch sensor may be formed from a flexible substrate such as a sheet of polymer. The flexible substrate may have a main rectangular portion and a protruding portion. Capacitive touch sensor electrodes may be formed on the upper and lower surfaces of the flexible substrate. Signal lines may be coupled to the touch sensor electrodes. The ends of the signal lines may extend onto the protruding portion. Signal lines may be formed on upper and lower surfaces of the flexible substrate. The signal lines may be coupled to circuitry on a printed circuit using a connector that receives the end of the protruding portion. Ground structures on the protruding portion may be configured to overlap the signal lines or may be laterally interposed between upper surface signal lines and lower surface signal lines.

16 Claims, 12 Drawing Sheets

(56) References Cited

U.S. PATENT DOCUMENTS

| | | |
|---|---|---|
| 6,310,610 B1 | 10/2001 | Beaton et al. |
| 6,323,846 B1 | 11/2001 | Westerman et al. |
| 6,690,387 B2 | 2/2004 | Zimmerman et al. |
| 7,015,894 B2 | 3/2006 | Morohoshi |
| 7,184,064 B2 | 2/2007 | Zimmerman et al. |
| 7,439,962 B2 | 10/2008 | Reynolds et al. |
| 7,663,607 B2 | 2/2010 | Hotelling et al. |
| 8,479,122 B2 | 7/2013 | Hotelling et al. |
| 2006/0007171 A1 | 1/2006 | Burdi et al. |
| 2006/0197753 A1 | 9/2006 | Hotelling |
| 2009/0283300 A1* | 11/2009 | Grunthaner .................. 174/254 |
| 2010/0200539 A1 | 8/2010 | Yun et al. |
| 2011/0012845 A1* | 1/2011 | Rothkopf et al. ............. 345/173 |
| 2011/0095999 A1* | 4/2011 | Hayton ........................ 345/173 |
| 2013/0056243 A1* | 3/2013 | Kim et al. .................... 174/250 |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

TOUCH SENSOR WITH INTEGRATED SIGNAL BUS EXTENSIONS

BACKGROUND

This relates generally to sensors, and more particularly, to touch sensors for electronic devices.

Electronic devices such as portable computers and cellular telephones are often provided with displays. Touch sensitive displays are often used to provide users with the ability to interact with a display through touch-based commands. Touch sensitive displays can be implemented using capacitive touch sensor. Capacitive touch sensors may also be used in forming computer track pads and other input devices.

A capacitive touch sensor may include an array of touch sensor electrodes. In configurations such as those in which the touch sensor is being used as part of a display, the touch sensor electrodes may be formed from pads of transparent conductive material such as indium tin oxide. When a user brings a finger or other external object into the vicinity of the touch sensor electrodes, touch sensor circuitry can detect changes in capacitance on the touch sensor electrodes. These detected capacitance changes can be processed to generate touch event data for controlling an electronic device.

To satisfy consumer demand for small form factor devices, capacitive touch sensor arrays are sometimes formed on thin flexible substrates such as sheets of polyimide. A flexible printed circuit signal bus formed from a separate strip of polyimide can be attached to the edge of touch sensor substrate to route signals from the touch sensor to a logic board within a device.

The signal lines in the flexible printed circuit bus may be attached to the capacitive touch sensor substrate using anisotropic conductive film. Care must be taken not to impose excessive stress on anisotropic conductive film bonds between the flexible printed circuit bus and the touch sensor substrate, because excessive stress may lead to reliability issues. This type of restriction on the amount of acceptable stress for the anisotropic conductive film bonds may impose undesired constraints on use of the flexible printed circuit bus when installing a touch sensor in an electronic device. For example, the acceptable bend radius for the flexible printed circuit bus may be limited. There may also be additional cost and complexity associated with attaching the flexible printed circuit bus to the touch sensor.

It would therefore be desirable to be able to provide improved touch sensors for electronic devices.

SUMMARY

An electronic device may have a display mounted in a housing. A touch sensor may be mounted over the display or may be mounted in other portions of the device.

The touch sensor may be formed from a flexible substrate such as a sheet of polymer. The flexible substrate may have a main rectangular portion and a protruding portion that protrudes from one or more edges of the main rectangular portion.

Capacitive touch sensor electrodes and associated signal lines may be formed on the upper and lower surfaces of the flexible substrate. The signal lines may be coupled to the touch sensor electrodes. The signal lines may extend onto the protruding portion of the flexible substrate. The signal lines on the protruding portion of the flexible substrate may be coupled to circuitry on a printed circuit using one or more connectors.

Ground structures on the protruding portion may be configured to overlap the signal lines or may be laterally interposed between upper surface signal lines and lower surface signal lines.

Further features of the invention, its nature and various advantages will be more apparent from the accompanying drawings and the following detailed description of the preferred embodiments.

DETAILED DESCRIPTION

Figure 1:
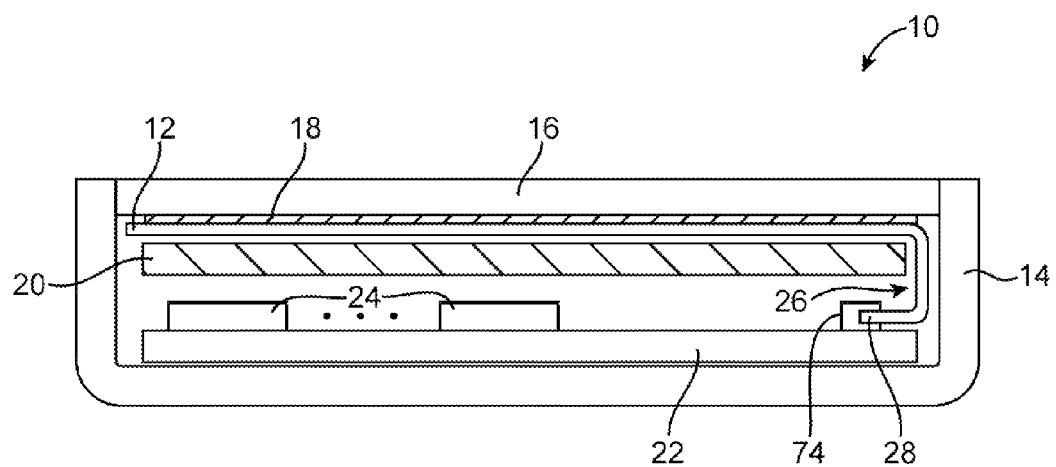
FIG. 1 is a cross-sectional side view of an illustrative electronic device having a touch sensor in accordance with an embodiment of the present invention.

Electronic devices such as electronic device 10 of FIG. 1 may be provided with one or more touch sensors such as touch sensor 12.

As shown in FIG. 1, device 10 may have a housing such as housing 14. Housing 14 may be formed from metal, glass, ceramic, plastic, fiber-based composites, other materials, or combinations of these materials.

A display such as display 20 may be mounted in housing 14. Display 20 may be a liquid crystal display, an organic light-emitting diode display, a plasma display, an electrowetting display, an electrophoretic display, or a display formed using other display technologies. Display 20 may be formed from one or more rigid substrate layers (e.g., one or more glass substrate layers) and/or one or more flexible substrate layers (e.g., one or more polymer layers).

Display cover layer 16 may cover display 20. Display cover layer 16 may be formed from glass, plastic, or other transparent material. Touch sensor 12 may be mounted between display 20 and display cover layer 16 using a layer of adhesive such as adhesive 18. If desired, touch sensor 12 may be mounted in housing 12 of device 10 using other arrangements. For example, touch sensor 12 may be attached to the upper surface of display structures 20 or may be incorporated into the layers of material that make up display structures 20. Touch sensors such as touch sensor 12 may also be incorporated into non-display components such as track pads or other input devices.

The touch sensor elements that form touch sensor 12 may be based on any suitable touch sensor technology such as acoustic touch technology, force-sensor-based touch technology, resistive touch technology, or capacitive touch technology (as examples). In capacitive touch sensors, capacitive electrodes may be formed from a conductive material. For example, for use in display applications in which the touch sensor electrodes are transparent to allow a user to view an underlying display, the touch sensor electrodes may be formed from a transparent conductive material such as indium tin oxide. Configurations in which touch sensor 12 is a capacitive touch sensor and in which touch sensor electrodes for touch sensor 12 are formed from transparent conductive materials are sometimes described herein as an example. Other types of arrangements may be used for touch sensor 12 if desired (e.g., arrangements with non-capacitive sensors, arrangements with capacitive electrodes formed from materials other than indium tin oxide, etc.).

The capacitive electrodes of touch sensor 12 may be formed on a substrate such as a transparent substrate. For example, the touch sensor electrodes may be formed on a rectangular clear flexible plastic substrate such as a sheet of polyimide or other polymer. As shown in FIG. 1, the substrate for touch sensor 12 may have an integral portion such as portion 26 that protrudes outward from the edges of the main portion of the touch sensor substrate. Portion 26 may be a flexible tail portion or other extending portion of touch sensor 12 that includes a signal bus for routing signals between display 12 and control circuitry such as control circuitry on printed circuit board 22.

One or more electronic components such as components 24 may be mounted in housing 14 of device 10. Components 24 may include integrated circuits, discrete components such as capacitors, resistors, and inductors, switches, speakers, microphones, connectors, and other electrical components. Components 24 may be mounted on one or more printed circuit boards such as printed circuit 22. Printed circuit 22 may be, for example, a rigid printed circuit board such as a board formed from fiberglass-filled epoxy (e.g., FR4) or may be a flexible printed circuit ("flex circuit") formed from a flexible sheet of polyimide or other flexible polymer. Components 24 may include surface mount technology (SMT) parts and other components that are mounted on printed circuit 22 using solder (as an example). The circuits that are mounted on printed circuit 22 may include, for example, one or more integrated circuits for controlling the operation of touch sensor 12. As an example, components 24 may include a touch sensor integrated circuit that converts raw capacitance data from touch sensor electrodes on touch sensor 12 into touch event data for processing by applications and operating system functions running on device 10.

Protruding flexible tail portion 26 of the touch sensor substrate may include conductive lines (e.g., metal traces) that form a signal bus. The signal bus may be used to conveying signals between touch sensor electrodes that are located on the main portion of touch sensor 12 that is located under cover layer 16 and components 24 on printed circuit 22. As shown in FIG. 1, end 28 of flexible tail portion 26 of touch sensor 12 may be connected to printed circuit 22 using one or more connectors such as connector 74. If desired, other attachment mechanisms may be used for connecting signal lines in portion 26 of touch sensor 12 to printed circuit 22 (e.g., conductive bonds formed from solder, conductive bonds formed from anisotropic conductive film, etc.). The use of connectors such as connector 74 to connect portions such as portion 26 of touch sensor 12 to circuitry on printed circuit 22 is merely illustrative.

Figure 2:
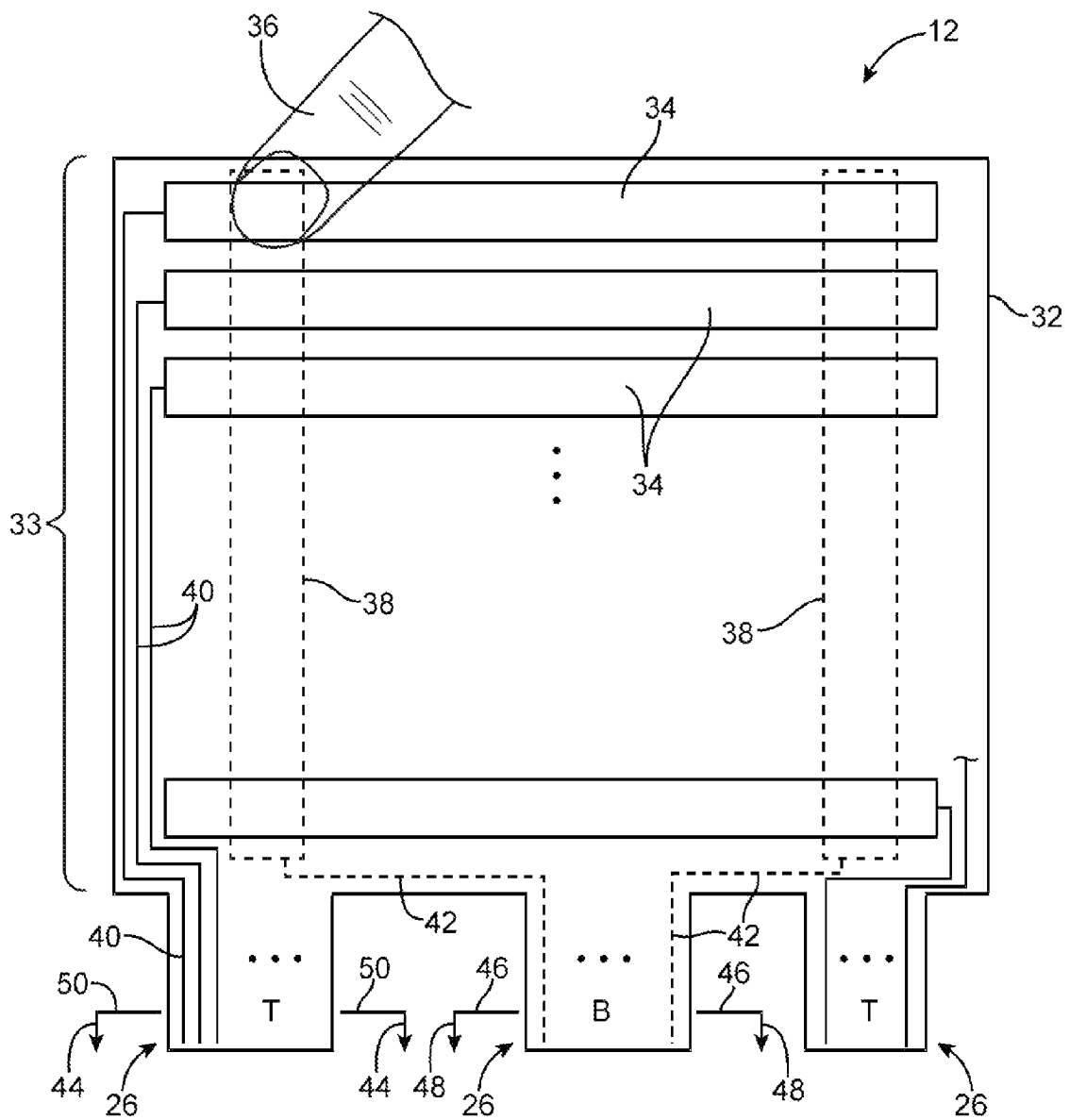
FIG. 2 is a top view of an illustrative touch sensor having integral flexible printed circuit bus structures in accordance with an embodiment of the present invention.

Tail portion 26 of touch sensor 12 may be formed from one or more extending (protruding) portions of the substrate used to form touch sensor 12. An illustrative configuration is shown in FIG. 2. As shown in the example of FIG. 2, touch sensor 12 may have a substrate such as substrate 32. Substrate 32 may have a main portion such as main portion 33 with a rectangular outline or other suitable shape. Protruding portion 26 may be formed from integral extending portions of substrate 32 that extend outwards from one or more of the edges of main portion 33.

Capacitive electrodes such as electrodes 34 and 38 may be formed on substrate 32. Electrodes 34 and 38 may have any suitable shapes (e.g., squares, diamonds, elongated rectangles, etc.). In the illustrative configuration of FIG. 2, electrodes 34 and 38 have the shape of elongated rectangles (i.e., strips). Electrodes 34 extend horizontally to form rows. Electrodes 38 extend vertically to form columns. By monitoring capacitance changes associated with the horizontal and vertical electrodes, touch sensor 12 may be used to ascertain the location of an external object such as finger 36 during a touch event (i.e., when a user of device 10 brings finger 36 in contact with cover glass 16 or otherwise brings finger 36 into close proximity to sensor 12).

Conductive lines such as conductive lines 40 may each be coupled to a respective one of electrodes 34 and may be routed from main portion 33 (e.g., a rectangular planar portion) of substrate 32 to protruding portion 26. Conductive lines 42 may each be coupled to a respective one of electrodes 38 and may likewise be routed from main portion 33 to protruding portion 26. In protruding portion 26, signal lines such as lines 40 and 42 may run parallel to each other and may form signal buses (i.e., protruding portion 26 may form an integral flexible printed circuit bus for touch sensor 12).

Conductive electrodes 38 and 34 may, if desired, be formed on the same side of substrate 32. In this type of arrangement, an intervening dielectric coating layer may be used to prevent electrodes 38 and 34 from being shorted to each other. In the illustrative configuration of FIG. 2, electrodes 34 and 38 are formed on opposing surfaces of substrate 32. In particular, electrodes 34 and associated signal routing lines 40 have been formed on the upper surface of substrate 32, whereas electrodes 38 and associated signal routing lines 42 have been formed on the lower surface of substrate 32.

Conductive lines 40 and 42 may be formed from conductive material such as metal (e.g., copper), transparent conductive material such as indium tin oxide, or other conductive substances. For example, conductive lines 40 and 42 may be copper lines, indium tin oxide lines, or lines that include a lower layer of indium tin oxide and an upper layer of copper (as examples).

Main portion 33 of substrate 32 may have a rectangular shape, a shape with curved edges, a shape with straight edges, a shape with curved and straight edges, or other suitable shapes. When mounted to a planar support structure such as planar cover glass 16 or planar display structures 20, main portion 33 may be maintained in a planar state. If desired, main portion 33 may be mounted to a curved surface (e.g., a curved cover glass, etc.).

Protruding structure 26 may extend from one or more edges of main portion 33. For example, protruding structure 26 may have three separate tab-shaped (e.g., rectangular) extending portions that each extend from the lower edge of main portion 33, as shown in FIG. 2. In this type of arrangement, portion 26 may have one or more sections (labeled "T" in FIG. 2) that are used to support lines 40 (i.e., signal lines on the top of substrate 32), and one or more sections (labeled "B" in FIG. 2) that are used to support lines 42 (i.e., signal lines on the lower surface of substrate 32). Lines 40 extend from the upper surface of substrate 32 to the upper surface of sections T. Within sections T of extended portion 26, lines 40 generally run parallel to each other and form a signal bus. Lines 42 extend from the lower surface of substrate 32 to the lower surface of section B of extended portion 26, where lines 42 form a signal bus.

In the example of FIG. 2, there is one "B" section and two "T" sections. This type of arrangement may help minimize the need for the lines associated with upper electrodes 34 (i.e., lines 40) from crossing the lines associated with lower electrodes 38 (i.e., lines 42). Minimizing crossing of the upper and lower signal lines in touch sensor 12 may improve touch sensor signal quality by reducing spurious signals due to unwanted coupling between the upper and lower lines. There may, in general, be any suitable number of "T" and "B" sections in extending portion 26. These sections of portion 26 may extend laterally from the lower edge of main portion 33, from one or more side edges of main portion 33, and/or from the top edge of portion 33.

Figure 3:
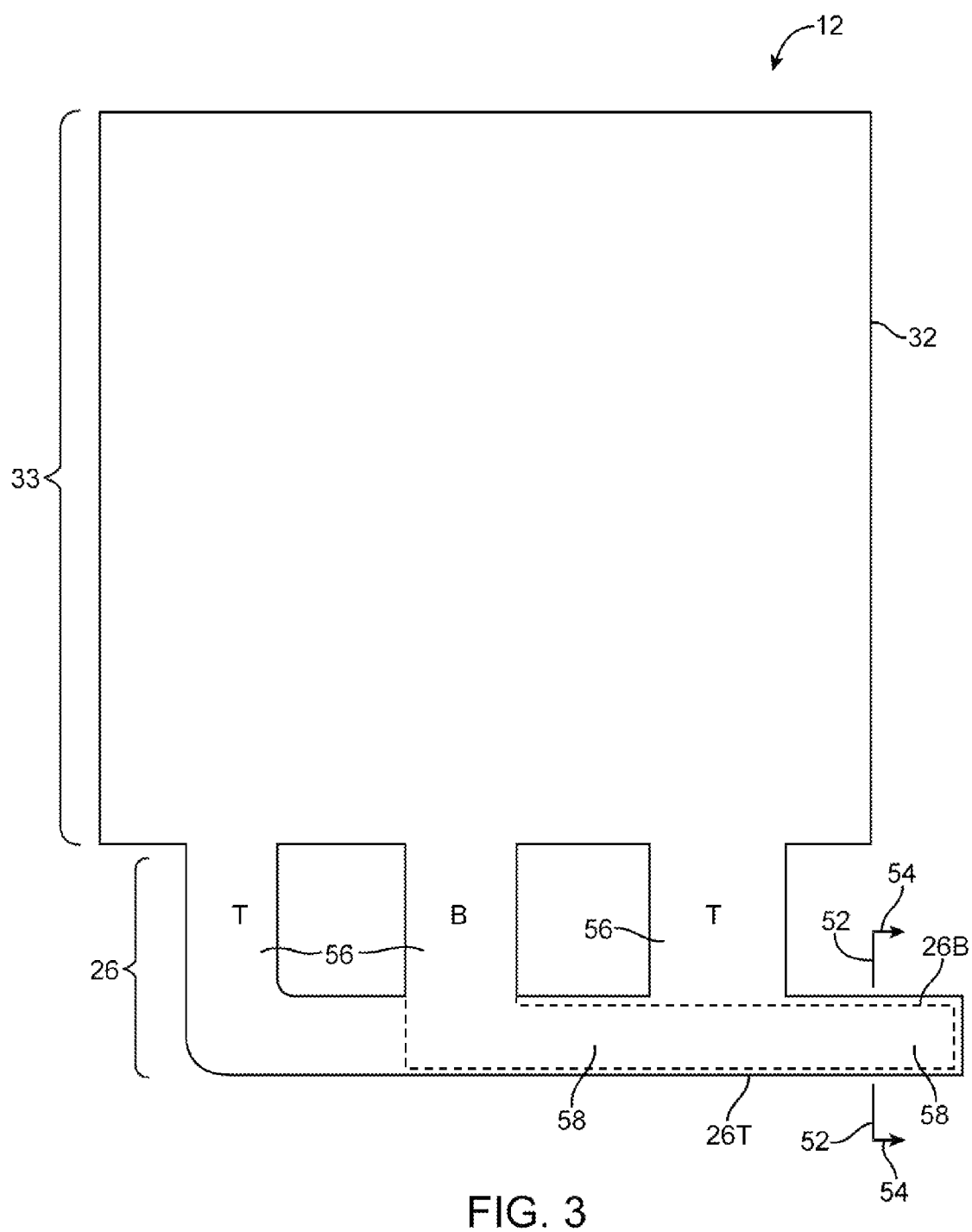
FIG. 3 is a top view of an illustrative touch sensor having integral flexible printed circuit bus structures on protruding tail portions that are attached to each other using adhesive in accordance with an embodiment of the present invention.

As shown in FIG. 3, sections T and B may be configured to overlap. This type of structure may be formed by laminating multiple polymer sheets together (as an example). With a configuration of the type shown in FIG. 3, sections T and B do not overlap in regions 56. In regions 58, portion 26T of sections T overlaps portion 26B of section B.

Figure 4:
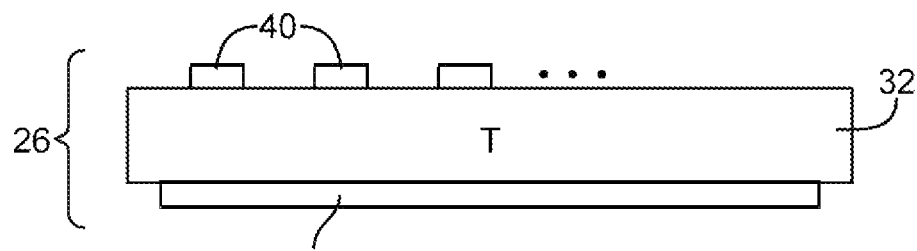
FIG. 4 is a cross-sectional side view of a flexible printed circuit bus structure having signal traces on an upper surface and a ground structure on an opposing lower surface in accordance with an embodiment of the present invention.

A cross-sectional side view of section T of extending portion 26 of substrate 32 of FIG. 2 taken along line 50 and viewed in direction 44 is shown in FIG. 4. As shown in FIG. 4, section T of extending portion 26 may include signal lines 40 that run along the upper surface of substrate 32 and an overlapping ground structure such as ground 60 that runs under the signal lines along the lower surface of substrate 32. Ground 60 may be formed from metal (e.g., copper), transparent conductor (e.g., indium tin oxide), a layered structure having a lower layer of indium tin oxide and an upper layer of copper or other metal, or other suitable conductive materials.

Figure 5:
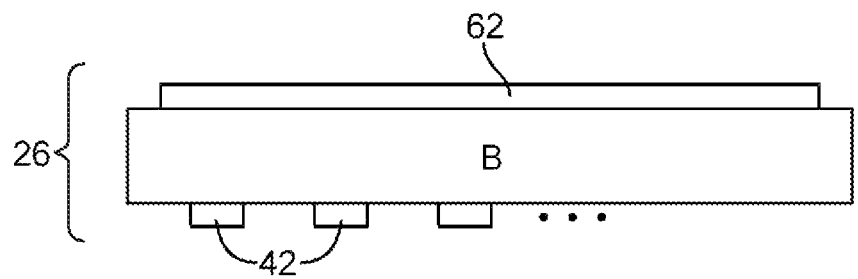
FIG. 5 is a cross-sectional side view of a flexible printed circuit bus structure having signal traces on a lower surface and a ground structure on an opposing upper surface in accordance with an embodiment of the present invention.

A cross-sectional side view of section B of extending portion 26 of substrate 32 of FIG. 2 taken along line 46 and viewed in direction 48 is shown in FIG. 5. As shown in FIG. 5, section B of extending portion 26 may include signal lines 42 that run along the lower surface of substrate 32 and an overlapping ground structure such as ground 62 that runs on top of the signal lines along the upper surface of substrate 32. Ground 62 may be formed from metal (e.g., copper), transparent conductor (e.g., indium tin oxide), a layered structure having a lower layer of indium tin oxide and an upper layer of copper or other metal, or other suitable conductive materials.

Figure 6:
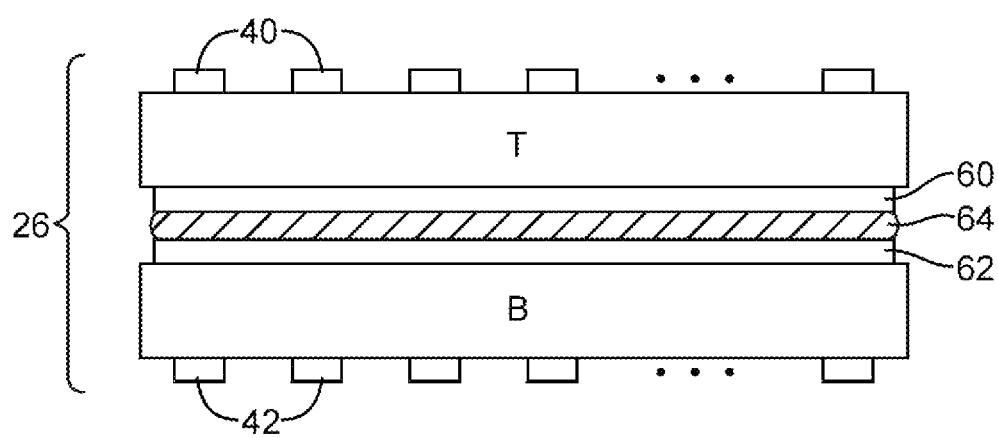
FIG. 6 is a cross-sectional side view of a flexible printed circuit bus structure formed by attaching bus structures of the type shown in FIG. 4 to bus structures of the type shown in FIG. 5 using adhesive in accordance with an embodiment of the present invention.

FIG. 6 is a cross-sectional side view of region 58 of extending portion 26 of touch sensor substrate 32 showing how upper section T may be attached to lower section B using adhesive such as adhesive 64.

Figure 7:
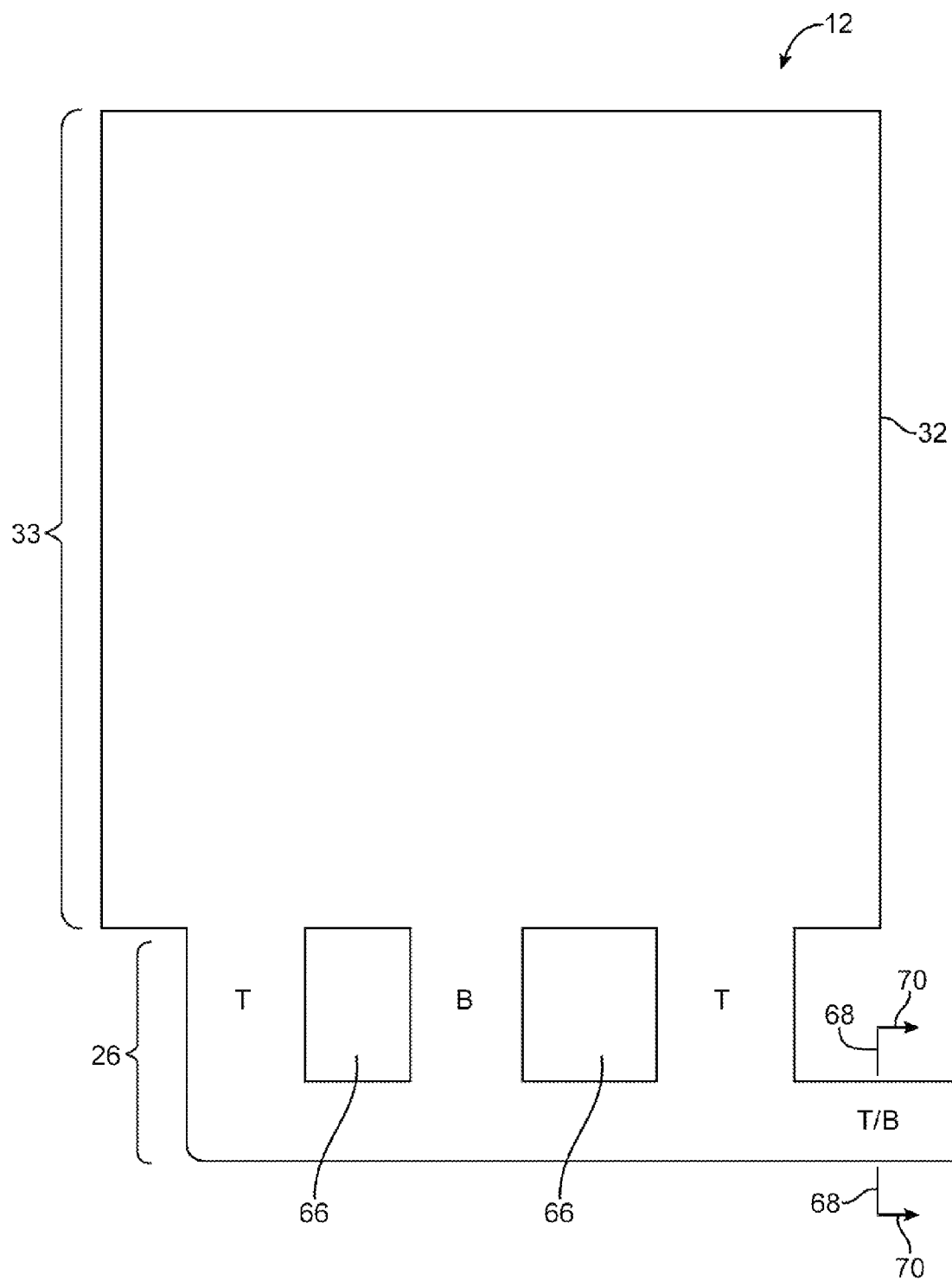
FIG. 7 is a top view of a touch sensor with an integral flexible printed circuit bus structure having regions with traces on an upper surface, regions with traces on a lower surface, and regions with traces on both the upper and lower surfaces in accordance with an embodiment of the present invention.

As shown in the top view of touch sensor 12 in FIG. 7, extending portion 26 may, if desired, include sections T and B that merge into a section "T/B" that includes signal lines on both upper and lower surfaces of substrate 32. Sections T and B may extend from different portions of the lower edge of main portion 33 of substrate 32 and may be separated by optional openings such as openings 66 in substrate 32. In sections T, lines 40 may run in parallel on the upper surface of substrate 32 whereas ground 60 may cover some or all of the lower surface of substrate 32. In section B, lines 42 may run in parallel on the lower surface of substrate 32 whereas ground 62 may cover some or all of the upper surface of substrate 32. In section T/B of extended portion 26 of substrate 32, lines 42 may be run in parallel along the upper surface of substrate 32 and lines 42 may run along the lower surface of substrate 32. To avoid signal interference, it may be desirable to laterally offset lines 40 and 42 so that they do not overlap each other.

Figure 8:
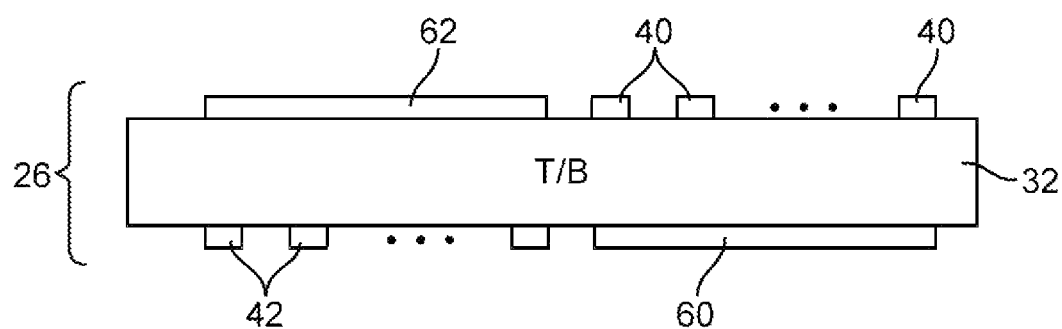
FIG. 8 is a cross-sectional side view of an illustrative configuration that may be used for the regions of the flexible printed circuit bus structure of FIG. 7 that include traces on both upper and lower surfaces in accordance with an embodiment of the present invention.

FIG. 8 is a cross-sectional side view of an illustrative section T/B of extended portion 26 of touch sensor substrate 32 of FIG. 7 taken along line 68 and viewed in direction 70. As shown in the illustrative configuration of FIG. 8, lines 40 and lines 42 may be formed on protruding portion 26 of common substrate 32. Lines 40 may run parallel to each other along the upper surface of substrate 32. Lines 42 may run parallel to each other along the lower surface of substrate 32. To minimize signal interference, lines 40 and lines 42 may be formed in different areas, so that lines 40 and lines 42 are laterally offset from each other and do not overlap. As shown in FIG. 8, for example, lines 40 may be formed on the right-hand side of section T/B and lines 42 may be formed on the left-hand side of section T/B.

Figure 9:
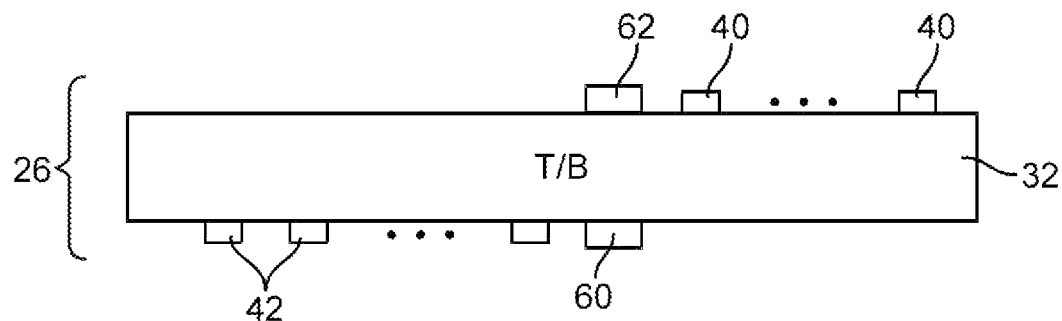
FIG. 9 is a cross-sectional side view of another illustrative configuration that may be used for the regions of the flexible printed circuit bus structure of FIG. 7 that include traces on both upper and lower surfaces in accordance with an embodiment of the present invention.

Grounding structures may be provided on substrate 32 such as ground structures 62 and 60. In the illustrative configuration of FIG. 8, ground structures 62 are formed on the upper surface of substrate 32 and overlap lines 42, whereas ground structures 60 are formed on the lower surface of substrate 32 and overlap lines 40. In the illustrative configuration of FIG. 9, ground structures 62 on the upper surface of substrate 32 are laterally interposed between lines 40 and 42, but do not overlap lines 42. Similarly, ground structures 60 on the lower surface of substrate 32 of FIG. 9 are laterally interposed between lines 42 and 40, but do not overlap lines 40. If desired, other configurations may be used (e.g., with ground structures 62 that partly overlap lines 42 and/or ground structures 60 that partly overlap lines 40, etc.).

The signal lines on extending portion 26 may be coupled to circuitry on a printed circuit such as printed circuit 22 of FIG. 1. Signal line connections between extended portion 26 of substrate 32 and circuitry in device 10 such as circuitry on printed circuit 22 may be formed using solder, anisotropic conductive film, connectors, other connection techniques, or combinations of these arrangements.

Figure 10:
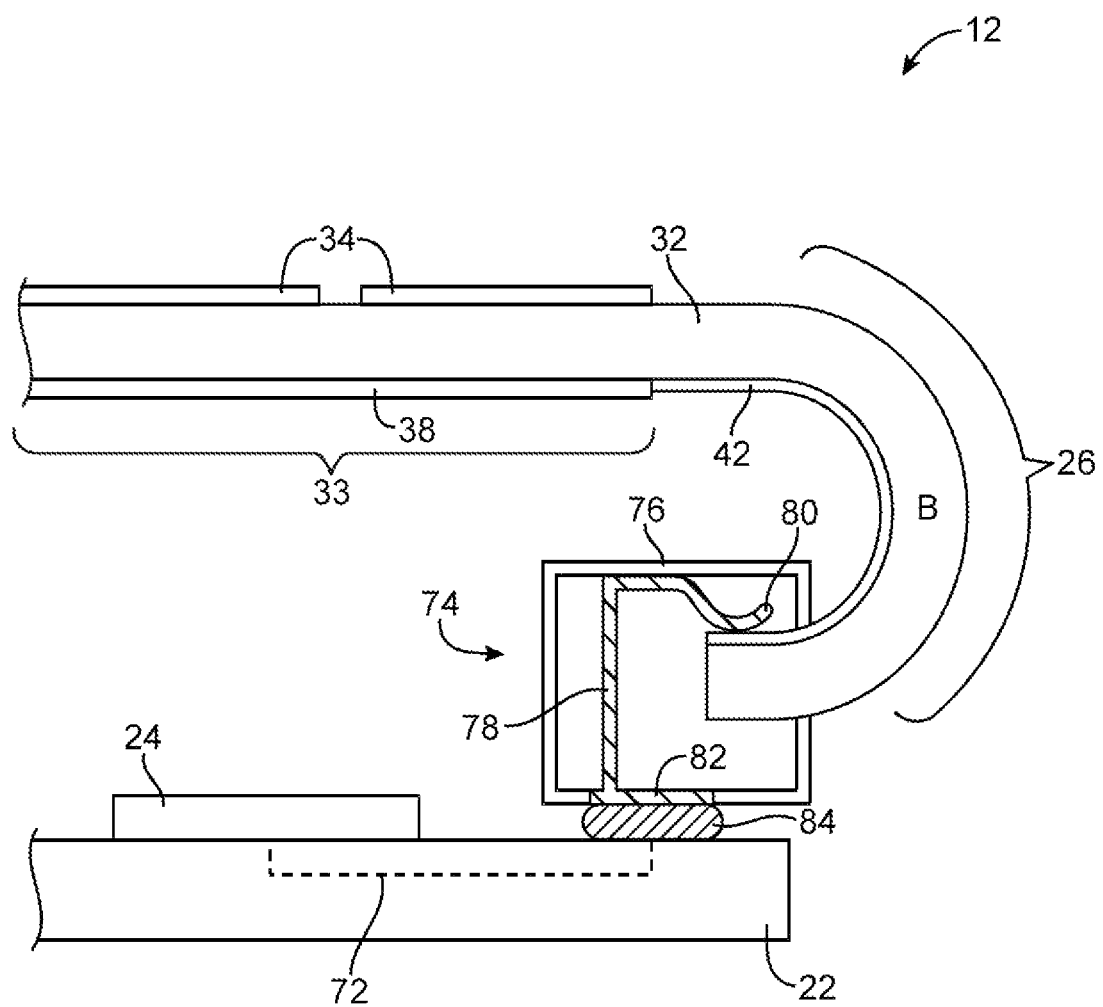
FIG. 10 is a cross-sectional side view of an illustrative touch sensor with an integral flexible printed circuit tail section having traces on its lower surface that is attached to a printed circuit using a connector in accordance with an embodiment of the present invention.

As shown in FIG. 10, for example, section B of extended portion 26 may be inserted into a connector such as connector 70 on printed circuit 22. Printed circuit 22 may include conductive paths (e.g., metal traces) such as path 72. Paths such as paths 72 may be coupled to electrical components such as component 24 (e.g., using solder). Extended portion 26 may include section B. Section B may be bent so that portion 26 may be received in connector 74. Signal lines 42 may be formed on the lower surface of substrate 32 in section B.

Figure 11:
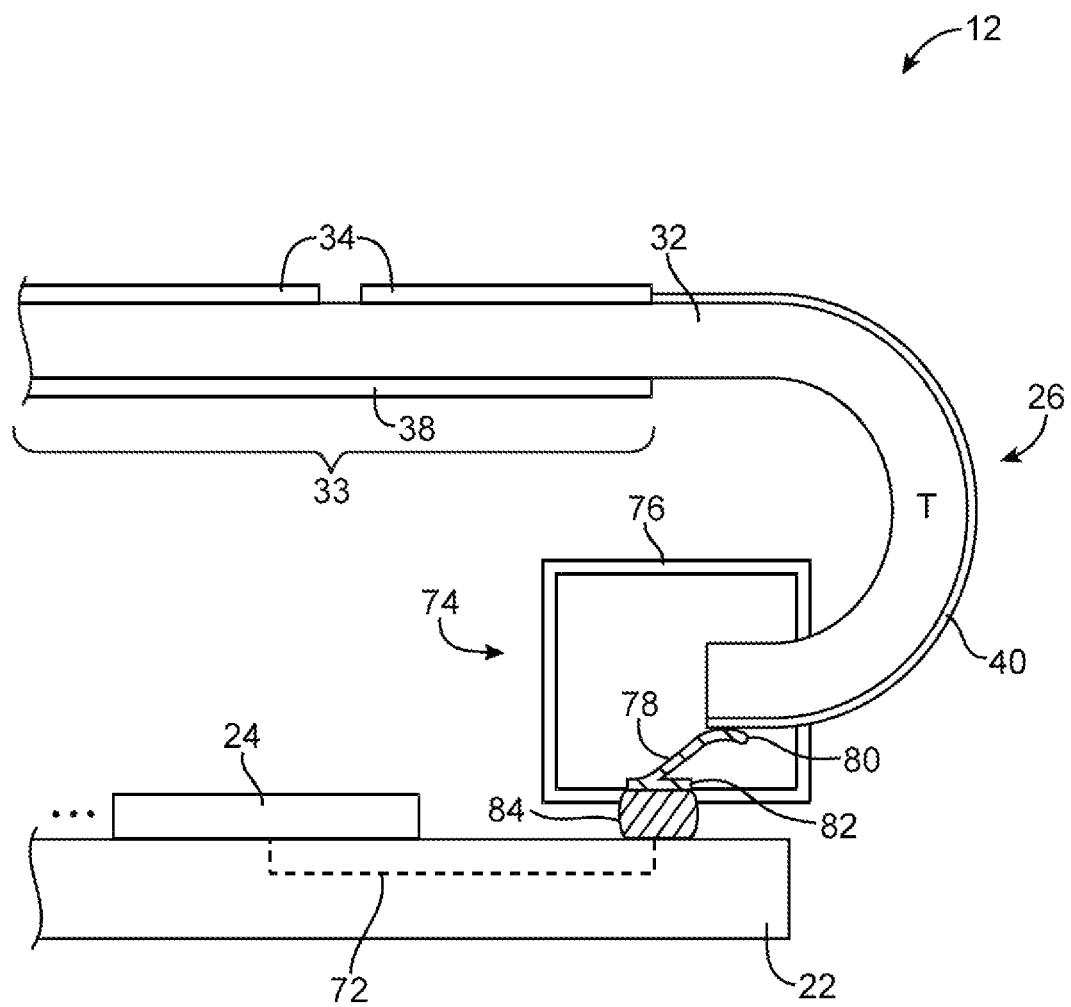
FIG. 11 is a cross-sectional side view of an illustrative touch sensor with an integral flexible printed circuit tail section having traces on its upper surface that is attached to a printed circuit using a connector in accordance with an embodiment of the present invention.

Connector 74 may have a connector housing such as connector housing 76. Metal structures such as metal spring structure 78 may be formed in housing 76 and may be used in interconnecting lines 42 to paths 72. As shown in FIG. 10, metal structure 78 may have a spring portion such as spring portion 80 that contacts a respective one of lines 42. Portion 82 of metal structure 78 may be connected to path 72 using solder 84 (as an example). Ground structures on extending portion 26 (not shown in FIG. 10) may be coupled to paths on printed circuit 22 using a separate metal structure. FIG. 11 shows how section T of extended portion may be coupled to printed circuit 22 using a connector such as connector 74. When section T of substrate 32 is inserted in connector 74, signal lines such as signal line 40 of FIG. 11 may be coupled to path 72 via metal structure 78 and solder 84. Ground structures on extending portion 26 (not shown in FIG. 11) may be coupled to printed circuit 22 using a separate metal structure.

Figure 12:
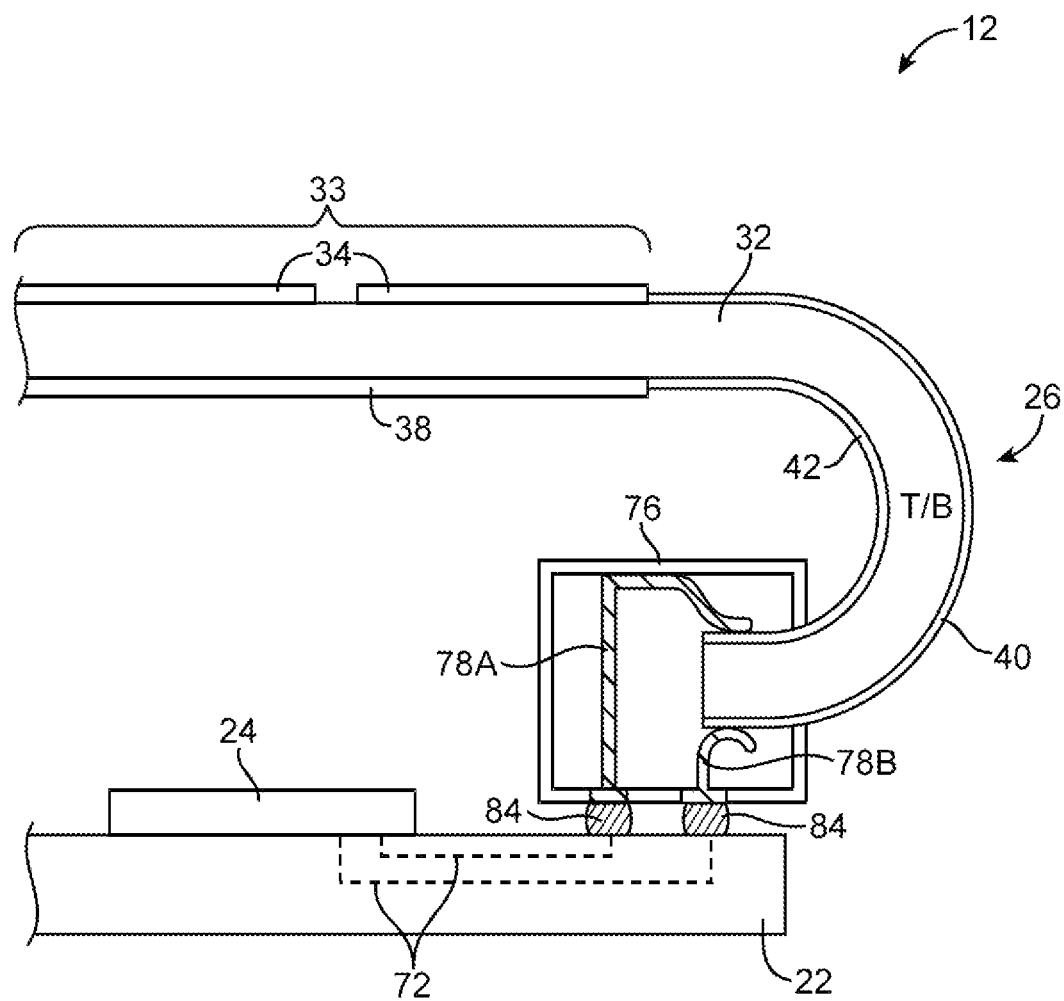
FIG. 12 is a cross-sectional side view of an illustrative touch sensor with an integral flexible printed circuit tail having traces on its upper and lower surfaces that may be attached to a printed circuit using a connector in accordance with an embodiment of the present invention.

If desired, connector 74 may include multiple metal structures such as metal structures 78A and 78B of FIG. 12. With this type of configuration, connector 74 may be used to form both upper and lower signal lines connections for a portion of extending portion 26 (e.g., section T/B such as sections T/B of FIGS. 8 and 9). As shown in FIG. 12, signal lines such as single line 40 may be coupled to paths 72 on printed circuit 22 using metal structures such as structure 78B and signal lines such as signal line 42 may be coupled to paths 72 on printed circuit 22 using metal structures such as structure 78A. Ground structures on extending portion 26 (not shown in FIG. 12) may likewise be coupled printed circuit 22 using metal structures in connector 74.

One or more sections of extended portion 26 of touch sensor substrate 32 may be connected to printed circuit 22 using connectors such as connector 74 of FIG. 10, connector 74 of FIG. 11, and/or connector 74 of FIG. 12 (e.g., one or more "B" sections, one or more "T" sections and/or one or more "T/B" sections).

Figure 13:
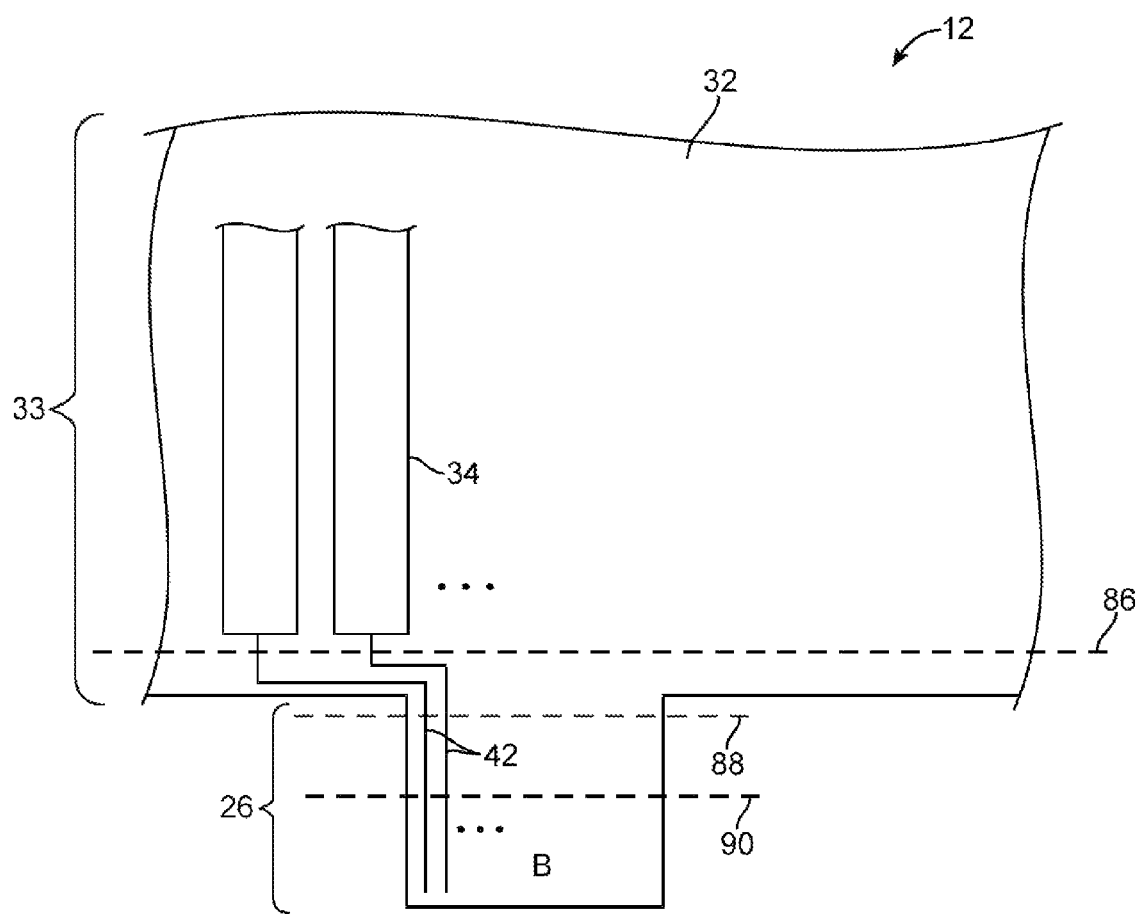
FIG. 13 is a top view of a portion of a touch sensor with an integral flexible printed circuit bus structure showing illustrative bend axis locations along which the flexible printed circuit bus structure may be bent in accordance with an embodiment of the present invention.

FIG. 13 is a top view of an illustrative portion of substrate 32 of touch sensor 12 showing illustrative locations for a bend axis along which substrate 32 may be bent when installed within housing 14. As shown in FIG. 13, substrate 32 may be bent along a bend axis such as bend axis 90 or a bend axis such as bend axis 88 to allow protruding portion 26 to be bent (see, e.g., FIGS. 1, 10, 11, and 12). If desired, substrate 32 may be bent along a bend axis such as bend axis 86 that intersects substrate 32 in main portion 33 (i.e., main portion 33 of substrate 32 may be bent in addition to or instead of bending protruding portion 26 of substrate 32). Configurations for touch sensor 12 in which substrate 32 is not bent may also be used.

Figure 14:
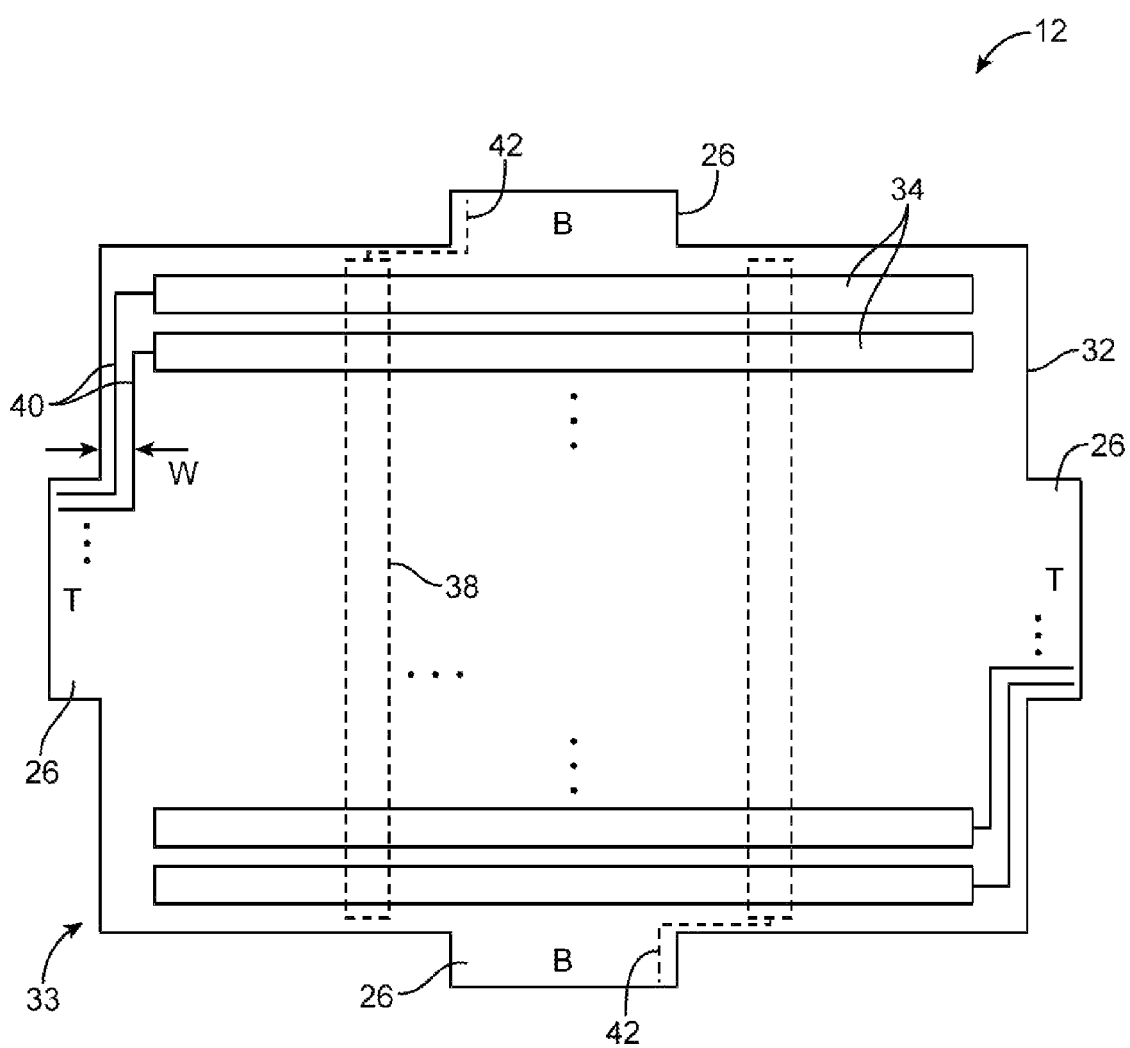
FIG. 14 is a top view of an illustrative touch sensor showing how integral flexible printed circuit bus structures may protrude outwards along one or more sides of a main rectangular portion of the touch sensor and may reduce signal path in accordance with an embodiment of the present invention.

Protruding portion 26 of substrate 32 may be formed along any suitable edge of main portion 33 of substrate 32. In the example of FIG. 14, protruding portion 26 has two sections ("T") formed as protruding extensions of the left and right edges of main portion 33 of substrate 32 on which parallel upper signal lines 40 are used to form signal buses. Protruding portion 26 also has two sections ("B") formed as protruding extensions of upper and lower edges of main portion 33 of substrate 32 on which parallel lower signal lines 42 are used to form signal buses.

By arranging sections of protruding portion 26 on each of the edges of substrate 32 as shown in FIG. 14, the length of signal lines such as signal lines 40 and 42 that are used in conveying signals between the capacitive touch sensor electrodes and protruding portion 26 can be minimized. Because the length of signal lines 40 and 42 can be reduced, less area is consumed by signal lines. As a result, the width W around the periphery of main portion 33 that is consumed by signal traces can be minimized and the inactive portion of touch sensor 12 can be minimized.

Figure 15:
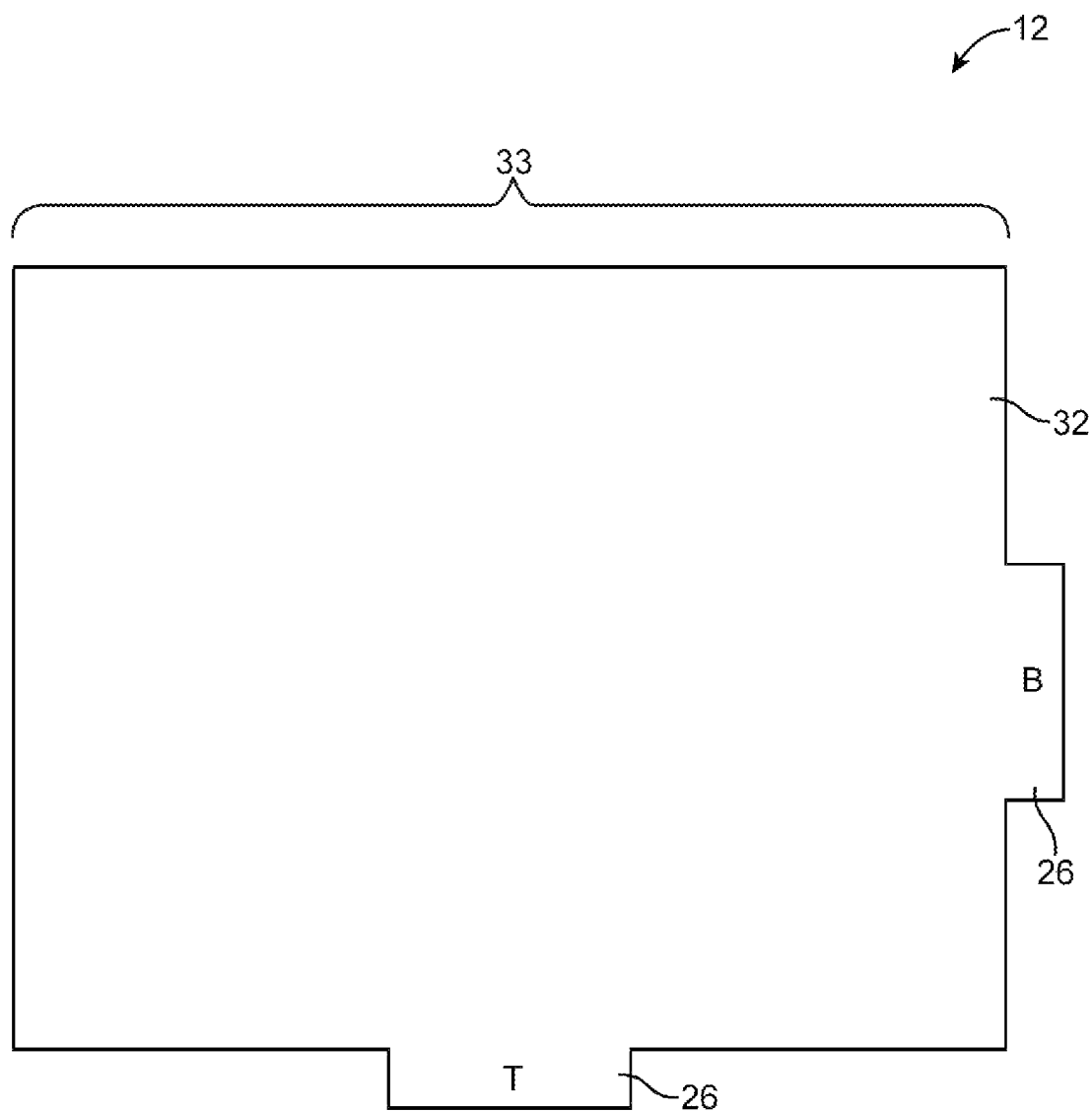
FIG. 15 is a top view of an illustrative touch sensor showing how integral flexible printed circuit bus structures may protrude outwards along two different edges of a rectangular touch sensor substrate in accordance with an embodiment of the present invention.

In the example of FIG. 14, protruding portion 26 protrudes from each of the four edges of rectangular main portion 33 of substrate 32. FIG. 15 is a top view of touch sensor 12 in an illustrative configuration in which protruding portion 26 extends from two of the four edges of main portion 33. Configurations in which different numbers of sections protrude from main portion 33 may be used (e.g., configurations with more than one section protruding from each side of main portion 33, configurations with extending sections on all four edge, on three edges, on two edges, or on one edge of portion 33, etc.).

The foregoing is merely illustrative of the principles of this invention and various modifications can be made by those skilled in the art without departing from the scope and spirit of the invention.

What is claimed is:

1. A touch sensor, comprising:
   a flexible substrate having opposing first and second surfaces, wherein the flexible substrate includes a main portion having a first edge with a first width and one or more extending portions having one or more widths less than the first width, the one or more extending portions extending from the first edge of the main portion;
   capacitive touch sensor electrodes on the substrate; and
   first and second signal lines that are coupled to the capacitive touch sensor electrodes and that extend along the one or more extending portions, wherein the one or more extending portions includes first and second sections, wherein the first section includes the first signal lines on the first surface and not the second signal lines on the first and second surfaces, and wherein the second section includes the second signal lines on the second surface and not the first signal lines on the second and first surfaces.

2. The touch sensor defined in claim 1 wherein the flexible substrate comprises a flexible sheet of polymer, and wherein the main portion comprises a rectangular main portion having four edges, and wherein the first edge from which the one or more extending portions extends comprises one of the four edges.

3. The touch sensor defined in claim 2 wherein some of the capacitive touch sensor electrodes are formed on the first surface, and wherein some of the capacitive touch sensor electrodes are formed on the second surface.

4. The touch sensor defined in claim 3 wherein the first section includes a first ground structure on the second surface that overlaps at least some of the first signal lines on the first surface and wherein the second section includes a second ground structure on the first surface that overlaps at least some of the second signal lines on the second surface.

5. The touch sensor defined in claim 3 wherein the capacitive touch sensor electrodes comprise indium tin oxide and wherein the first and second signal lines comprise a conductive material selected from the group consisting of: metal and indium tin oxide.

6. The touch sensor defined in claim 3 wherein the one or more extending portions includes at least one additional section that includes the first signal lines on the first surface and that includes a ground structure on the second surface that overlaps at least some of the first signal lines on the first surface.

7. An electronic device, comprising:
a housing;
a display mounted in the housing; and
a touch sensor that overlaps the display, wherein the touch sensor includes a flexible substrate having a main portion including a first edge with a first width, opposing first and second surfaces, first and second signal lines, and a plurality of separated extending portions having one or more widths less than the first width, the plurality of separated extending portions extending from the first edge;
wherein a first extending portion of the plurality of separated extending portions includes the first signal lines on the first surface and not the second signal lines on the first and second surfaces, and wherein a second extending portion of the plurality of separated extending portions includes the second signal lines on the second surface and not the first signal lines on the second and first surfaces.

8. The electronic device defined in claim 7 wherein at least one of the extending portions is bent.

9. The electronic device defined in claim 7 wherein the touch sensor comprises capacitive touch sensor electrodes on the flexible substrate and wherein the first and second signal lines are coupled to the capacitive touch sensor electrodes.

10. The electronic device defined in claim 9 wherein the touch sensor further comprises a ground structure on the second surface that at least partially overlaps the first signal lines on the first surface.

11. The electronic device defined in claim 7 wherein the first and second signal lines are laterally offset from each other and wherein the touch sensor further comprises:
first ground structures on the second surface of the first extending portion that at least partially overlap the first signal lines; and
second ground structures on the first surface of the second extending portion that at least partially overlap the second signal lines.

12. The electronic device defined in claim 7 wherein the first and second extending portions overlap each other in an overlapping region and wherein the touch sensor further comprises:
first ground structures on the second surface of the first extending portion in the overlapping region, wherein the first ground structures are laterally interposed between the first and second signal lines;
second ground structures on the first surface of the second extending portion in the overlapping region, wherein the second ground structures are laterally interposed between the first and second signal lines.

13. The electronic device defined in claim 9 further comprising:
a printed circuit;
at least one integrated circuit mounted on the printed circuit; and
a connector on the printed circuit that receives at least one of the extended portions and has metal structures coupled to one or more of the first and second signal lines.

14. A touch sensor, comprising:
a flexible polymer sheet having opposing first and second surfaces, wherein the flexible polymer sheet includes a main portion having a first edge with a first width and one or more protruding portions having one or more widths less than the first width, the one or more protruding portions protruding from the first edge;
capacitive touch sensor electrodes on the flexible polymer sheet; and
signal lines that are connected to the capacitive touch sensor electrodes and that extend onto the one or more protruding portions, wherein the signal lines include first signal lines on the first surface and second signal lines on the second surface, wherein the one or more protruding portions has a first section on which the first signal lines are formed on the first surface and not the second signal lines on the first and second surfaces, and a second section on which the second signal lines are formed on the second surface and not the first signal lines on the second and first surfaces, and wherein the first and second signal lines are non-overlapping.

15. The touch sensor defined in claim 14 wherein the main portion is rectangular and has four edges including the first edge.

16. The touch sensor defined in claim 14 wherein some of the capacitive touch sensor electrodes are formed on the first surface, wherein some of the capacitive touch sensor electrodes are formed on the second surface, wherein the first signal lines are coupled to the capacitive touch sensor electrodes on the first surface, and wherein the second signal lines are coupled to the capacitive touch sensor electrodes on the second surface.

* * * * *